United States Patent [19]
Schneider et al.

[11] 4,138,670
[45] Feb. 6, 1979

[54] A.C. POWERED DETECTING DEVICE WITH BATTERY BACKUP

[75] Inventors: Quentin L. Schneider, Bensenville; Richard J. Schwarzbach, Naperville, both of Ill.

[73] Assignee: Pittway Corporation, Northbrook, Ill.

[21] Appl. No.: 756,494

[22] Filed: Jan. 3, 1977

[51] Int. Cl.² .............................................. G08B 17/10
[52] U.S. Cl. .................... 340/507; 340/509; 340/629; 340/636; 340/693
[58] Field of Search ......................... 340/237, 249, 333; 250/381, 382, 384, 385

[56] References Cited
U.S. PATENT DOCUMENTS

| | | | |
|---|---|---|---|
| 3,728,706 | 4/1973 | Tipton et al. ...................... | 340/237.5 |
| 3,811,123 | 5/1974 | Hamm et al. ........................ | 340/249 |
| 3,899,732 | 8/1975 | Staby .................................. | 340/249 X |
| 3,955,186 | 5/1976 | Green et al. ....................... | 340/237 R |
| 3,980,997 | 9/1976 | Berns et al. ........................ | 340/237.5 |

*Primary Examiner*—Donald J. Yusko
*Assistant Examiner*—Daniel Myer
*Attorney, Agent, or Firm*—Gary, Juettner & Pyle

[57] ABSTRACT

An improved a.c. voltage powered warning device for detecting the occurrence of predetermined phenomena, is characterized by battery backup for providing power to the device in the event of interruption of the a.c. voltage. In the disclosed embodiments the warning device is a fire detector having circuitry for supervising the energy level of the backup battery and for providing a warning upon the energy level decreasing to a predetermined value, and for testing a combustion detecting and alarm generating portion of the detector.

29 Claims, 3 Drawing Figures

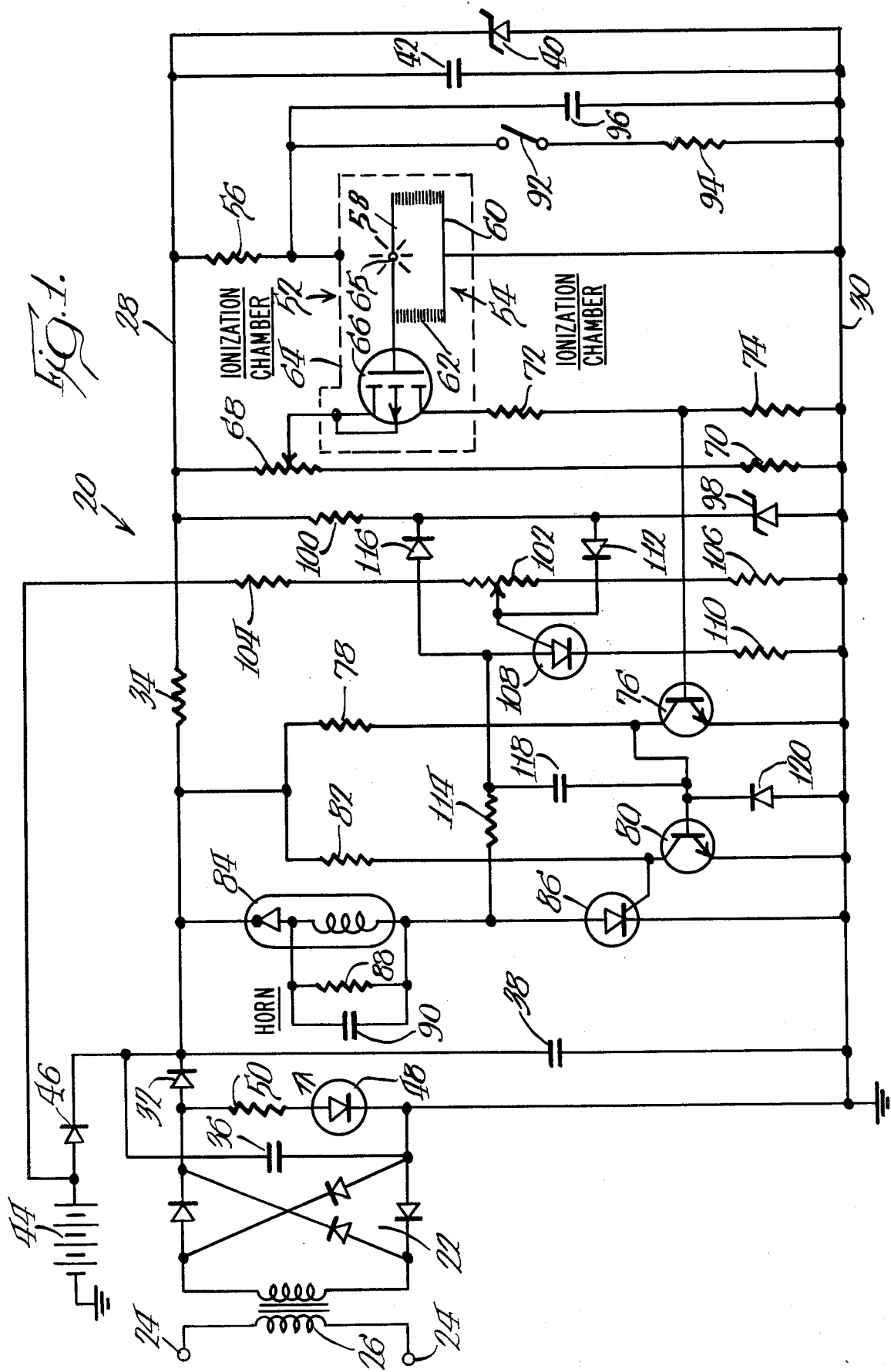

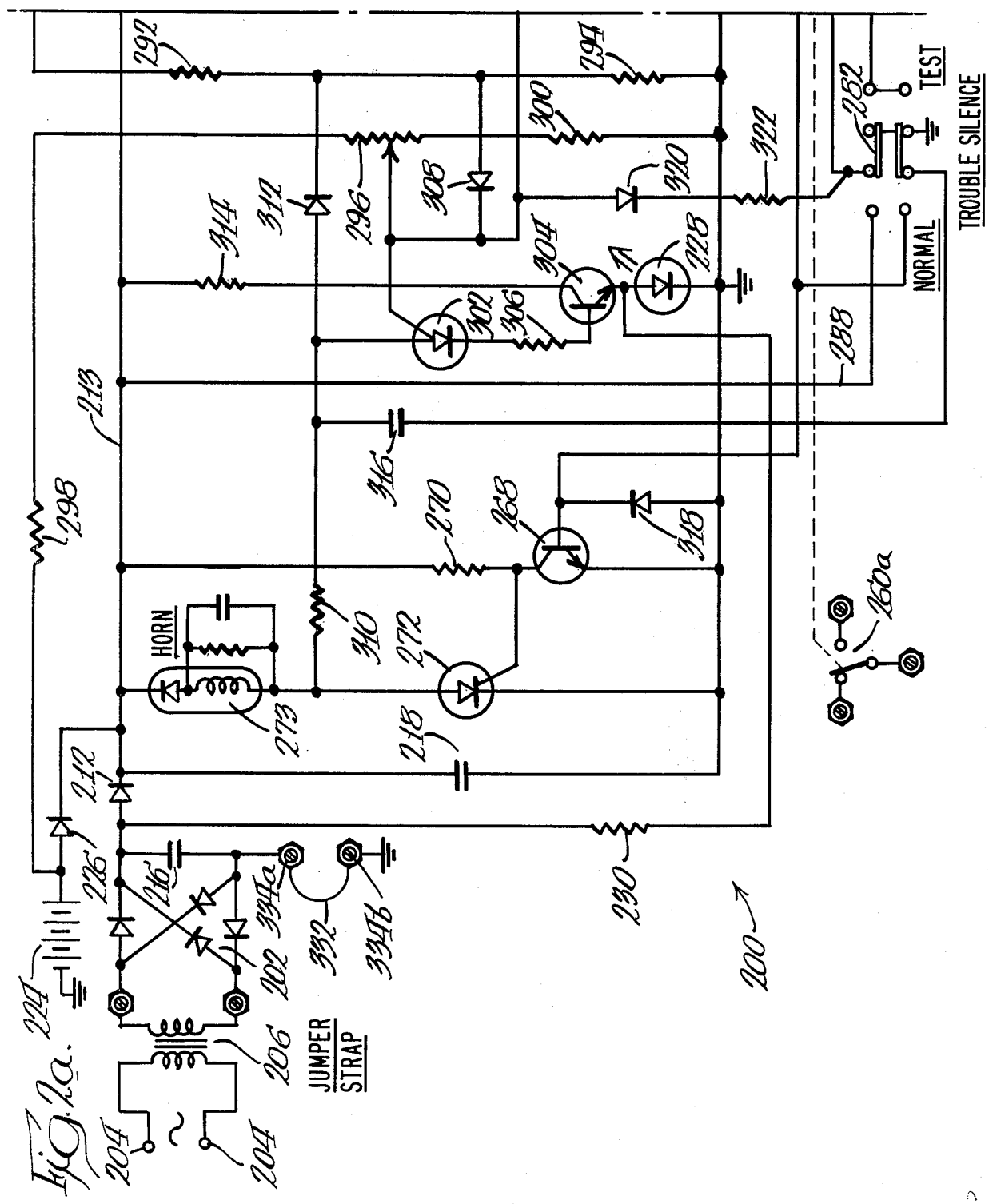

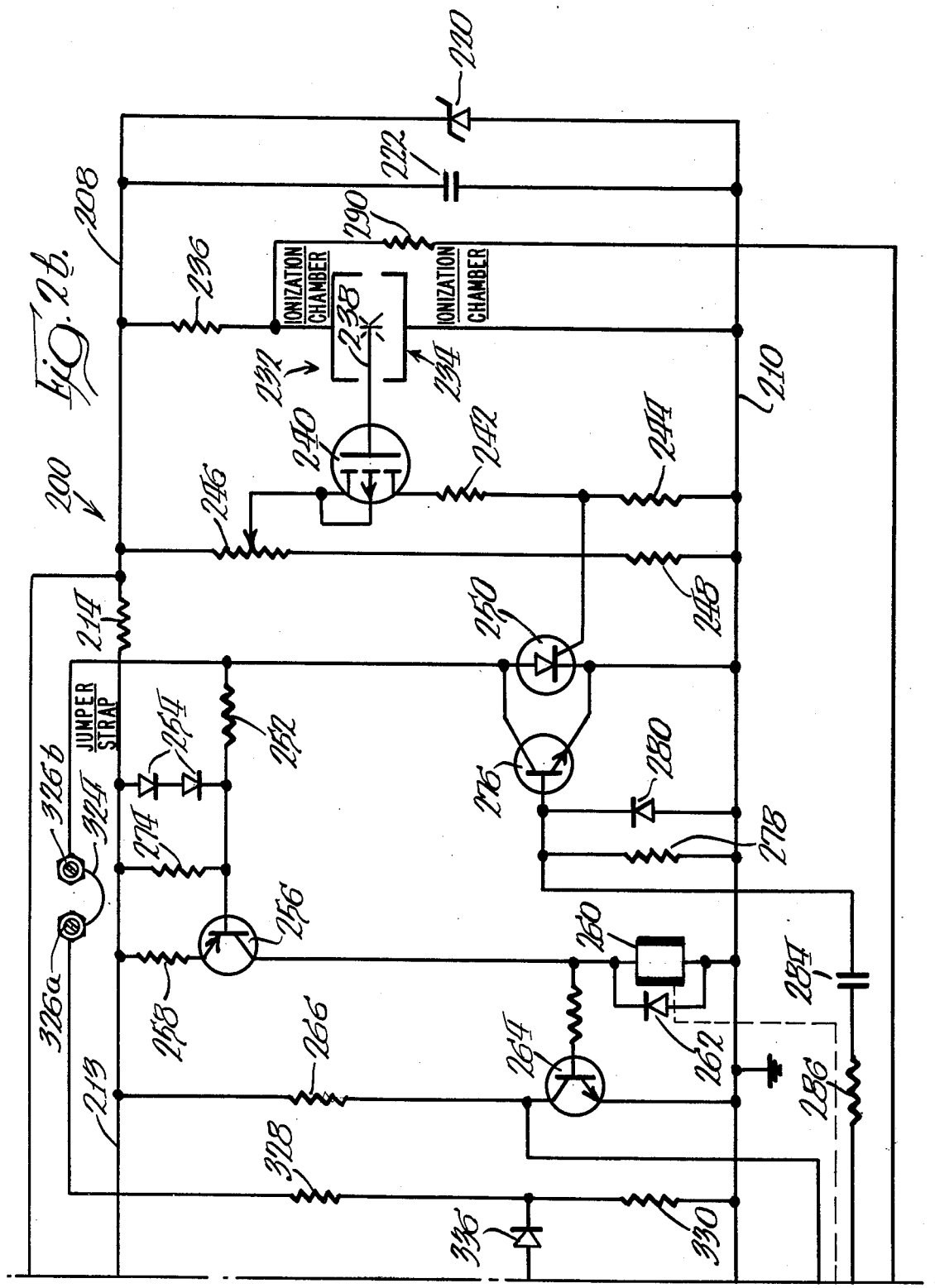

A.C. POWERED DETECTING DEVICE WITH BATTERY BACKUP

BACKGROUND OF THE INVENTION

The present invention relates to warning devices, and in particular to an a.c. powered fire detector having battery backup for providing power to the detector in the event of interruption of the a.c. power source.

Battery powered fire detectors for detecting the presence of products of combustion are self-sufficient for their power, and are advantageously used in situations either where a.c. power is not available, or where available a.c. power may reasonably be expected to be occasionally interrupted, particularly in the event of combustion. Such detectors may include means for supervising the energy level of the battery and for generating an indication, which is customarily an intermittent sounding of an audible alarm, upon the energy decreasing to a predetermined level to warn a user of the detector of the need for battery replacement. Should the detector be unattended for an extended period of time during which the low battery power indication is generated, it is possible for the battery to become completely depleted in generating the indication whereby the detector, when again attended, will neither provide the low battery power warning nor respond to products of combustion. Further, upon the occurrence of combustion, the detector generates an alarm, which is ordinarily a continuous sounding of the audible alarm, only for so long as the battery has sufficient power to operate the alarm, and thereafter becomes silent. As such detectors usually respond to the incipient stages of combustion, it is possible for the battery thereof to become completely exhausted in providing the alarm during the very early stages of combustion. Should the detector be unattended at that time, then a user thereof will receive no warning at a later time, even though the combustion may not yet have reached an advanced stage.

A.C. powered fire detectors depend for their operation upon an external source of a.c. voltage. As compared with battery powered detectors, there are no batteries to replace, and the detectors remain responsive to the presence of products of combustion to continue to generate an alarm for as long as the a.c. voltage is applied thereto. Unfortunately, unlike battery powered detectors, the a.c. powered detector is not self-sufficient for its power, and upon interruption of the a.c. voltage the detector becomes inoperative. Such interruption may result from normally occurring power failures, or as a consequence of the combustion itself, particularly where an electrical fire is involved.

Thus, neither battery powered fire detectors nor a.c. powered detectors may reliably be assumed to be continuous in their operation. It would, therefore, be extremely desirable to combine into a single detector the specific advantages offered by each of the battery and the a.c. powered detectors — continuous operation for so long as a.c. line power is available, yet self-sufficiency in the event line power is interrupted.

OBJECTS OF THE INVENTION

An object of the present invention is to provide a.c. powered fire detectors having battery backup for powering the detectors in the event of failure of the a.c. power source.

Another object of the present invention is to provide such detectors having means for supervising the reserve power level of the battery backup and for providing a warning upon the power decreasing to a predetermined level.

Yet another object of the present invention is to provide such detectors having means for conveniently and reliably manually testing the combustion sensing portions thereof.

SUMMARY OF THE INVENTION

In accordance with the present invention, a warning device for sensing the occurrence of predetermined phenomena has means for applying power thereto from a first source of power and for switching the application of power thereto to from a second source of power in the event of interruption of power from the first source.

In the embodiments of the invention the warning device is a fire detector responsive to the presence of products of combustion to generate an alarm. The detector is ordinarily powered by a source of a.c. voltage, and has a battery power source for providing backup power to the detector in the event of interruption of the a.c. voltage. Battery supervision circuitry monitors the reserve energy level of the battery and provides an indication upon a decrease in the energy to a predetermined level, and manually operable switch means enables a user of the detector to conveniently and completely test the combustion sensing and alarm generating portion of the detector.

As a consequence of the detector being a.c. powered with battery backup, the detector remains operative even upon failure of the a.c. power source. Further, the battery supervision circuit warns a user of the detector of the need to replace the battery, and the testing means enables the user to be assured of proper detector operation in the event of combustion, significant safety advantages.

The foregoing and other objects, advantages and features of the invention will become apparent from a consideration of the following detailed description, when taken in conjunction with the appended drawings.

BRIEF DESCRIPTION OF THE DRAWINGS

FIG. 1 is a schematic illustration of an a.c. powered fire detector in accordance with one embodiment of the invention, having battery backup and means for supervising the reserve energy level of the backup battery, and means for manually testing the combustion sensing portion of the detector.

FIGS. 2a and 2b are schematic illustrations of an a.c. powered fire detector, having battery backup, in accordance with another embodiment of the invention.

DETAILED DESCRIPTION

Referring to the drawings, there are shown two embodiments of detectors for sensing the presence of predetermined phenomena and for generating an indication thereof. Each detector is for being powered primarily by a source of a.c. voltage, and includes a backup battery for providing power for uninterrupted operation of the detector in the event of failure of the a.c. source. The detectors include means for supervising the power levels of the batteries, and means for testing the operability of the entire phenomena sensing and indication generating portions thereof.

More particularly, and referring first to the embodiment of the detector shown in FIG. 1 and indicated generally at 20, the detector includes a rectifier bridge 22 for receiving an a.c. line voltage across a pair of input terminals 24 through a step-down transformer 26, and for providing a d.c. voltage across a pair of conductor means 28 and 30, the conductor means 28 receiving the voltage through a diode 32 and a resistor 34. Capacitors 36 and 38 filter and smooth the output voltage from the bridge, and means are provided, such as a zener diode 40 in parallel with a filter capacitor 42, for regulating the voltage between the conductor means to a predetermined value.

A battery backup circuit for the detector includes a battery 44 connected through a diode 46 between the conductor means 30, which is circuit ground for the detector, and the cathode of the diode 32. The transformer 26 is selected to provide, when the detector is powered by the a.c. source, a voltage at the cathode of the diode 46 of sufficient nominal value to reverse bias the diode, the diode thus preventing charging of the battery by the a.c. source, and a light emitting diode (LED) 48, in series with a resistor 50 across the rectifier bridge output, lights to indicate application of a.c. power to the detector. Should the a.c. voltage source be interrupted, the LED will extinguish, and the diode 46 will be forward biased by the battery, whereby the battery will provide power to the detector for uninterrupted operation thereof.

Where the detector is a fire detector, the phenomena to be sensed is combustion, and the combustion sensing portion of the detector includes a sensor, shown as an active ionization chamber 52, in series with a reference impedance, shown as a reference ionization chamber 54, both chambers being connected in series with a resistor 56 between the conductor means 28 and 30. The reference chamber includes conductive electrodes 58 and 60 which are maintained in a spaced relationship by a spacer 62 of insulating material, the electrodes and the spacer together forming a relatively imperforate closure. The active chamber includes a relatively perforate conductive housing 64 forming one electrode thereof in a spaced relationship with the electrode 58, the electrode 58 forming the other electrode of the chamber and being common to both the active and the reference chambers. Means are provided, such as a radioactive source 65 positioned within a passage through the electrode 58, for ionizing air molecules within both of the chambers, whereby with a voltage applied across the electrode 60 and the housing 64 an electric field is generated within each chamber to establish a current flow therethrough by movement of the ions between the electrodes. The active and the reference chambers thus form a voltage divider circuit, the impedance of each chamber being at least several magnitudes greater than the impedance of the resistor 56, and the voltage at the electrode 58 at the juncture between the chambers is therefore essentially in accordance with the relative impedances of the chambers. In the alternative, the active and the reference chambers may be physically separate ionization chambers connected in series without a common electrode therebetween, in which case the juncture between the chambers exhibits the voltage in accordance with the relative impedances of the chambers.

Changes in ambient conditions affect the ion current flow through the chambers, and therefore the impedances thereof. Natural changes in ambient conditions, such as changes in barometric pressure, temperature and relative humidity, occur slowly, and for such changes the relatively closed reference chamber responds (changes its impedance) substantially simultaneously and in proportion with the active chamber, and the voltage at the electrode 58 remains essentially constant. The reference chamber thus compensates the bridge circuit for slow changes in ambient conditions. For relatively rapid changes in ambient conditions, as occur with combustion, products of combustion concentrate in the relatively open active chamber much more rapidly than in the reference chamber. The products of combustion have a greater mass than air molecules, and upon entry into the active chamber they combine with the ionized air molecules therein to effectively reduce the current flow therethrough in accordance with their concentrations. The reduced current flow increases the impedance of the chamber and, for the circuit connections shown, causes a decrease in the voltage at the common electrode 58. A predetermined change in the voltage at the electrode 58 may, then, be used as an indication of the occurrence of combustion.

Means for monitoring the voltage at the electrode 58 and for generating an indication upon a predetermined change in the value thereof includes a field-effect transistor (FET) 66 connected at its gate with the electrode and positioned within the active chamber housing 64 for being shielded against external static electricity and electric fields. A potentiometer 68 and a resistor 70 are connected in series between the conductor means 28 and 30, and the drain-source circuit path of the FET is connected in series with a pair of voltage divider resistors 72 and 74 between a slider for the potentiometer and the conductor means 30. The potentiometer setting establishes a reference voltage for the FET, and for a given setting the conductivity of the FET, and therefore the current flow therethrough and the voltage at the juncture of the resistors 72 and 74, is determined by the voltage at the electrode 58, with a decrease in the value of the electrode voltage causing an increase in the conductivity of the FET, and therefore an increase in the voltage at the juncture of the resistor. A first transistor 76 is connected at its base to the juncture between the resistors, at its emitter to the conductor means 30, and at its collector to the cathode of the diode 32 through a resistor 78. A second transistor 80 is connected at its base to the collector of the transistor 76, at its emitter to the conductor means 30, and at its collector to the cathode of the diode 32 through a resistor 82.

An indication or alarm generating means includes an audible alarm, shown as a horn 84, connected in series with a silicon controlled rectifier (SCR) 86 between the cathode of the diode 32 and the conductor means 30. The gate of the SCR is connected to sense the voltage at the collector of the transistor 80 for having the SCR triggered into conduction thereby. Upon conduction of the SCR the horn is connected across the power input to the circuit, which may be either the rectifier bridge output or the battery, to sound an alarm, with a resistor 88 and a capacitor 90 then providing suppression for the horn.

Under ambient conditions in the absence of products of combustion the electrode 58 is substantially at a first potential, and the potentiometer 68 is adjusted to control the conductivity of the FET so that the voltage at the juncture of the resistors 72 and 74 is less than sufficient to render the transistor 76 conductive. With the transistor 76 nonconductive, the transistor 80 is biased into conduction through the resistor 78 to maintain the SCR nonconductive, whereby the horn is not sounded.

Upon the occurrence of combustion, the relatively rapid increase in the impedance of the active chamber, with respect to that of the reference chamber, causes a decrease in the voltage at the electrode 58. This increases the conductivity of the FET sufficiently to render the transistor 76 conductive. Conduction of the transistor 76 turns off the transistor 80 by applying to the base thereof a voltage substantially equal to that on the conductor means 30, whereby the SCR receives at its gate through the resistor 82 the voltage at the cathode of the diode 32. This triggers the SCR into conduction to energize the horn and sound an alarm until the active chamber is cleared of products of combustion.

Means for completely and reliably testing the combustion sensing portion of the detector, to ensure proper operation thereof in the event of combustion, includes a manually operable test switch 92 connected in series with a resistor 94 between the active chamber electrode 64 and the reference chamber electrode 60. The resistance of the chamber voltage divider is several magnitudes greater than the impedance of the resistor 94, so that upon closure of the switch the resistors 56 and 94 are connected as a voltage divider, and the voltage across the chambers is made equal to the voltage across the resistor 94. A capacitor 96 smooths changes in voltage across the chambers, and the resistors 56 and 94 are selected to have values to decrease the voltage across the chambers by an amount which is sufficient to change or decrease the potential at the electrode 58 by an amount causing increased conduction of the FET to trigger the SCR into conduction to generate the alarm. Thus, operation of the test switch provides a change in the voltage at the electrode 58 as would occur upon combustion, and operates the entire combustion sensing and alarm generating portion of the detector to sound an alarm. As compared with prior detectors having test switches which ordinarily operate only the audible alarm of the detector to test the alarm and the sufficiency of the power supplied thereto, the switch 92 allows a user of the detector to conveniently, quickly and reliably test all combustion sensing and alarm generating components of the detector, a significant safety advantage.

Particular advantages in the initial adjustment of the sensitivity of the detector are obtained if the values of the resistors 56 and 94 are selected to provide at the electrode 58, upon operation of the switch 92, a voltage exactly equal to that which would occur if products of combustion were in the active chamber in the minimum concentrations whereat it is desired to generate an alarm. With the resistors so selected and the switch closed, the potentiometer 68 is then set to the point where the SCR is just triggered into conduction, whereupon the sensitivity of the detector circuit is properly adjusted.

To warn a user of the detector of a decrease in available power in the backup battery 44 to a level requiring replacement thereof, the detector includes means for supervising the energy level of the battery and for providing a warning or indication when the level decreases to a predetermined value. The voltage across the battery decreases as the reserve energy thereof decreases, and the battery supervision means monitors the voltage and energizes the horn 84 to provide the warning when the voltage drops to a predetermined value. As compared with the warning provided upon the occurrence of combustion, which is a continuous sounding of the horn, the warning for low battery voltage is an intermittent sounding of the horn, with the periods during which the horn is sounded being significantly shorter than the periods during which the horn is silent. As a result, the two warnings are sensually discernable, and a user of the detector is readily appraised whether the warning indicates the presence of combustion or the need for replacement of the battery.

Means for monitoring the voltage of the battery and for generating a warning upon a decrease thereof to a predetermined value includes a zener diode 98 in series with a resistor 100 between the conductor means, and a potentiometer 102 in series with a pair of resistors 104 and 106 across the battery. The zener diode generates a reference potential thereacross, and the voltage at a slider of the potentiometer is representative of the battery voltage and varies directly in proportion therewith. A programmable unijunction transistor (PUT) 108 is connected at its cathode with the conductor means 30 through a resistor 110, at its gate both with the slider of the potentiometer and with the reference potential through a diode 112, and at its anode both with the anode of the SCR through a resistor 114 and with the reference potential through a diode 116. A capacitor 118 is connected in series with a diode 120 between the anode of the PUT and the conductor means 30, and the junction between the capacitor and the diode is connected with the base of the transistor 80. The voltage at the anode of the PUT thus equals the reference voltage across the zener diode 98 plus the forward voltage drop of the diode 116, the voltage at the gate of the PUT equals the voltage at the slider of the potentiometer 102, and the PUT therefore compares the reference voltage with the voltage representative of the battery voltage and becomes conductive when the battery voltage decreases to a predetermined low value, as determined by the setting of the potentiometer 102.

With the battery voltage above the predetermined low value the diode 112 is reverse biased, the diode 116 is forward biased, and the capacitor 118 is charged to the voltage at the anode of the PUT through the resistor 114. When the battery voltage decreases to the predetermined low value, the voltage at the gate of the PUT becomes sufficiently negative with respect to the voltage at the anode thereof to render the PUT conductive. Upon conduction of the PUT the capacitor 118 discharges through the anode thereof and provides a negative voltage excursion at the base of the transistor 80 to turn off the transistor and to trigger the SCR into conduction to sound the horn, the diode 120 at this time limiting the voltage excursion at the base of the transistor to the forward voltage drop of the diode. As the capacitor 118 discharges through the PUT the diode 116 becomes reverse biased, and the diode 112 is forward biased to pull up the gate of the PUT to assist turn off of the PUT when the current supplied by the capacitor falls below the anode valley current thereof. When capacitor 118 discharges sufficiently that the PUT becomes nonconductive, the transistor 80 again becomes conductive to remove the trigger voltage from the SCR to render the SCR nonconductive and the horn silent with the next opening of the horn contacts. The capacitor 118 then charges through the resistor 114, the rate of charge of the capacitor through the resistor being slower than the rate of discharge thereof through the PUT. When the capacitor charges sufficiently, such that the anode of the PUT is sufficiently positive with respect to the gate thereof, the PUT is again rendered conductive and the above described cycle of operation is repeated.

The parameters of the components of the battery voltage supervision circuit are chosen so that the period of time during which the horn is sounded is shorter than the period of time during which the horn is silent, whereby a user of the detector is readily appraised whether the sounding of the horn indicates combustion or low battery voltage. Further, as power to the horn to indicate low battery voltage is normally provided by the a.c. source, the battery is not relatively rapidly depleted by the power requirements of the horn, and continues to serve as a standby power source for the detector for a considerable period of time.

Referring to FIGS. 2a and 2b there is shown a fire detector, indicated generally at 200, in accordance with another embodiment of the invention. The detector is a.c. voltage powered with battery backup, and includes means for supervising the energy level of the battery and for providing a warning upon the energy decreasing to a predetermined level, means for selectively silencing the low battery energy warning, and means for conveniently and completely testing the operation of the combustion sensing and alarm generating portions of the detector.

More particularly, the detector includes a rectifier bridge 202 for receiving an a.c. voltage across a pair of terminals 204 through transformer 206, and for providing a d.c. voltage across a pair of conductor means 208 and 210, the conductor means 208 receiving the voltage through a diode 212, a conductor means 213, and a resistor 214. Capacitors 216 and 218 filter the output from the bridge, and the voltage across the conductor means 208 and 210 is regulated to a predetermined value by, for example, a zener diode 220 in parallel with a filter capacitor 222.

A reserve, standby or backup power supply for the detector is provided by a battery 224 connected between the conductor means 210 and 213 through a diode 226. With a.c. power applied to the detector, the diode 226 is reverse biased by the voltage at its cathode, thus preventing charging of the battery by the a.c. source. Should the a.c. source be interrupted, the diode 226 then immediately becomes forward biased, connecting the battery with the detector circuit for providing power thereto. Operation of the detector is therefore continuous, irrespective of interruptions in the a.c. power source, with an LED 228 in series with a resistor 230 between the anode of the diode 212 and the conductor means 210 lighting to indicate application of a.c. power to the detector.

Means for sensing combustion and for generating an indication in response thereto include a voltage divider circuit of a series connected active ionization chamber and reference ionization chamber, indicated generally at 232 and 234, respectively, both connected in series with a resistor 236 between the conductor means 208 and 210. A common electrode 238 between the chambers is connected with the gate of a field-effect transistor (FET) 240 for controlling the conductivity thereof, and drain-source circuit of the FET is connected in series with a pair of resistors 242 and 244 between the conductor means 210 and a slider of a potentiometer 246. The potentiometer is in series with a resistor 248 between the conductor means, and the setting of the potentiometer establishes a reference potential for the FET. For a given setting the conductivity of the FET, and therefore the voltage at the juncture of the resistors 242 and 244, is determined by the potential at the electrode 238, the arrangement being such that upon the presence of combustion the potential of the electrode decreases to increase the conductivity of the FET and thereby the voltage at the juncture.

An SCR 250 is connected with its anode-cathode circuit in series with a resistor 252 and a pair of diodes 254 between the conductor means 210 and 213, and at its gate to the juncture of the resistors 242 and 244 for being triggered into conduction by the voltage thereat. A transistor 256 is connected at its emitter with the conductor means 213 through a resistor 258, at its collector with the conductor means 210 through a parallel connected relay 260 and diode 262, and at its base with the junction between the resistor 252 and diodes 254. The collector of the transistor is also connected to the base of a transistor 264, the emitter of the transistor 264 being connected to the conductor means 210, and the collector to the conductor means 213 through a resistor 266. A transistor 268 is connected at its base with the collector of the transistor 264, at its emitter with the conductor means 210, and at its collector with the conductor means 213 through a resistor 270. An SCR 272 is connected with its cathode-anode circuit in series with an alarm device, shown as an audible horn 273, between the conductor means 210 and 213, and at its gate with the collector of the transistor 268 for being triggered into conduction by the voltage thereat.

Under ambient conditions in the absence of products of combustion, the potentiometer 246 is adjusted so that the voltage at the juncture of the resistors 242 and 244 is less than sufficient to trigger the SCR 250 into conduction. With the SCR nonconductive, the transistor 256 is maintained nonconductive by the voltage at its base through a resistor 274, the transistor 264 is maintained nonconductive by the voltage at its base through the relay 260, and the transistor 268 is conductive as a result of the voltage at its base through the resistor 266. Conduction of the transistor 268 applies the voltage on the conductor means 210 to the gate of the SCR 272, whereby the SCR is nonconductive and the horn is silent.

Should combustion occur, the increased conductivity of the FET increases the voltage at the junction of the resistors 242 and 244 sufficiently to trigger the SCR 250 into conduction. This renders the transistor 256 conductive, which in turn energizes the relay and causes the transistor 264 to conduct. Energizing the relay operates contacts 260a thereof, which may, for example, be connected to actuate a remote alarm. Conduction of the transistor 264 then turns off the transistor 268 to apply a trigger voltage to the gate of the SCR 272 through the resistor 270, whereby the SCR conducts to sound the horn.

To render the SCR 250 nonconductive to silence the horn after products of combustion are cleared from the active chamber, a transistor 276 is connected with its emitter-collector across the SCR. The base of the transistor is connected with the conductor means 210 through a resistor 278 and a diode 280, and with a manually actuable switch 282 through a capacitor 284 and a resistor 286. In the normal operation of the detector the switch is in its leftmost or NORMAL position, which charges the capacitor 284 to the voltage on the conductor means 213 through a connection 288. To reset the SCR 250, the switch is first moved to its center or TROUBLE SILENCE position, which discharges the capacitor to circuit ground. Upon discharge of the capacitor, the diode 280 limits the negative voltage excursion at the base of the transistor 276 to prevent possible destruction thereof. The switch is then returned to its NORMAL position to again charge the capacitor and to apply a positive going voltage transition therethrough and to the base of the transistor 276 to momentarily turn on the transistor. When the transistor 276 conducts it shorts across and resets the SCR, which in turn causes the transistors 256 and 264 to become nonconductive, the relay to deenergize, and the transistor 268 to become conductive. The SCR 272 is then reset to its off state with the next opening of the horn contacts.

To test the combustion sensing and alarm generating portions of the circuit, the switch 282 has a rightmost TEST position which connects a resistor 290 across the active and the reference chambers and in series with the resistor 236 to change the voltage across the chambers sufficiently to change the potential at the electrode 238 to a value as would occur upon combustion. As with the detector of FIG. 1, the values of the resistors 236 and 290 are advantageously selected to provide at the electrode 238 a potential as would occur when products of combustion are in the active chamber in the minimum concentrations whereat it is desired to generate an alarm. In such case, with the switch in the TEST position the potentiometer 246 in set to the point whereat the SCR 250 is just rendered conductive, whereupon the sensitivity of the detector is properly adjusted.

With the switch in its NORMAL position, which is its setting for the usual operation of the detector, means for monitoring the voltage of the battery and for generating a warning when the voltage decreases to a predetermined value includes a pair of resistors 292 and 294 connected across the zener diode 220, and a potentiometer 296 in series with a pair of resistors 298 and 300 across the battery. The zener diode generates a reference potential at the juncture of the resistors 292 and 294, and the voltage at a slider of the potentiometer is representative of the battery voltage and varies directly in proportion therewith. A programmable unijunction transistor (PUT) 302 is connected at its cathode with the base of a transistor 304 through a resistor 306, at its gate both with the slider of the potentiometer and with the reference potential through a diode 308, and at its anode both with the anode of the SCR 272 through a resistor 310 and with the reference potential through a diode 312. The transistor 304 is connected with its emitter-collector in series with the LED and a resistor 314 between the conductor means 210 and 213, and a capacitor 316 is connected through the switch and in series with a diode 318 between the anode of the PUT and the conductor means 210, the junction between the capacitor and the resistor being connected with the base of the transistor 268. Thus, the voltage at the anode of the PUT equals the reference voltage between the resistors 292 and 294 plus the forward voltage drop of the diode 312, the voltage at the gate of the PUT equals the voltage at the slider of the potentiometer 296, and the PUT therefore compares the reference voltage with the voltage representative of the battery voltage and becomes conductive when the voltage across the battery decreases to a predetermined low value, as determined by the setting of the potentiometer.

With the battery voltage above the predetermined low value, the diode 308 is reverse biased, the diode 312 is forward biased, and the capacitor 316 is charged through the resistor 310 to the voltage at the anode of the PUT. Upon a decrease in the battery voltage to the predetermined low value, the voltage at the gate of the PUT becomes sufficiently negative with respect to the voltage at the anode thereof to render the PUT conductive. Conduction of the PUT renders the transistor 304 conductive to increase the current flow through the LED, whereby the intensity of the light emitted thereby increases, and discharges the capacitor 316 to provide a negative going voltage excursion at the base of the transistor 268 to turn off the transistor, the diode 318 at this time limiting the voltage excursion to the forward voltage drop thereof. When the transistor 268 becomes nonconductive the SCR 272 is triggered into conduction and the horn is sounded. As the capacitor 316 discharges the diode 312 becomes reverse biased, and the diode 308 is forward biased to pull up the gate of the PUT to assist turn off of the PUT when the current supplied by the capacitor falls below the anode valley current thereof. When the capacitor discharges sufficiently that the PUT becomes nonconductive, the intensity of the light from the LED decreases, and the transistor 268 again becomes conductive to remove the trigger voltage from the SCR, whereby the SCR becomes nonconductive and the horn silent with the next opening of the horn contacts. The capacitor then charges through the resistor 310, at a rate slower than the discharge rate thereof through the PUT, and when the capacitor charges sufficiently so that the anode of the PUT is again positive with respect to the gate thereof, the PUT is again rendered conductive and the above described cycle of operation is repeated.

As with the circuit of FIG. 1, the parameters of the components of the battery supervision circuit are chosen so that the period of time during which the horn is sounded and the LED is flashed is significantly shorter than the period of time during which the horn is silent, whereby a user of the detector is readily appraised whether the alarm is in response to combustion or to low battery voltage. Also, as power to the horn to indicate low battery voltage is normally provided by and a.c. source, the battery is not relatively rapidly depleted by the power requirements of the horn, and continues to serve as a standby power source for the detector for a considerable period of time.

With the switch in the NORMAL position, upon low battery voltage the horn will continue to sound intermittently until the battery is replaced. A user of the detector may, if desired, silence the low battery audible warning, without affecting the response of the detector to combustion, by moving the switch to the center TROUBLE SILENCE position. This changes the connection of the capacitor 316 from the base of the transistor 268 to ground, whereby the transistor will not intermittently be rendered nonconductive to sound the horn. The battery supervision circuit, however, otherwise continues to function as described, with the LED flashing to provide a visual warning of low battery voltage.

It is possible for a user of the detector, after replacement of the battery or otherwise, to leave the switch in its TROUBLE SILENCE position, whereby an audible warning of low battery voltage will not be generated. To warn a user that the switch is in the TROUBLE SILENCE position, movement of the switch to that position also connects a diode 320, connected with the gate of the PUT, with circuit ground through the resistor 322, the diode otherwise being reverse biased by the voltage on the conductor means 213 through the resistor and the connection 288. This decreases the voltage at the gate of the PUT to a value sufficient to operate the low battery voltage warning circuit, irrespective of the actual voltage of the battery. Thus, with the switch in the TROUBLE SILENCE position the LED continues to flash, even after replacement of the battery, until the switch is returned to its NORMAL position. The LED, therefore, generates four visually distinct signals or indications: (a) a first when no light is emitted to indicate interruption of a.c. power; (b) a second when light is intermittently emitted with no light otherwise being emitted to indicate both interruption of a.c. power and either low battery voltage or the switch being in its TROUBLE SILENCE position; (c) a third when a constant intensity light is emitted to indicate that a.c. power is being applied to the detector, and (d) a fourth when intermittent bright flashes are imposed on the constant intensity light to indicate both application of a.c. power to the detector and either low battery voltage or the switch being in its TROUBLE SILENCE position.

The detector may also advantageously include means for detecting the presence of intruders or for interconnecting with other detectors. This is provided by a remote sensing loop 324 connected with a pair of terminals 326a and 326b between the conductor means 208 and 210 through the diodes 254, the resistor 252 and a pair of resistors 328 and 330, and by a remote sensing loop 332 connected with a pair of terminals 334a and 334b between one output from the rectifier and circuit ground. The juncture of the resistors 328 and 330 is connected with the gate of the PUT 302 through a diode 336, the diode with the connections shown being reverse biased.

In the use of the loops to detect intruders means are provided, such as a normally open microswitch (not shown) between the loops, to connect the loops together upon the presence of an intruder, whereby circuit ground on the loop 332 is applied through the resistor 252 to the base of the transistor 256. This renders the transistor conductive to cause an alarm to be generated, in the manner described, for as long as the connection is maintained.

To interconnect a plurality of the detectors is a system so that all of the detectors sound an alarm in response to any one of the detectors sensing combustion, the terminals 326a, 326b, 334a and 334b of each detector are connected with the like corresponding terminals of every other detector, with the loops 324 and 332 being removed from all of the detectors except one. Should one of the detectors sense combustion, conduction of its SCR 250 will apply circuit ground on the conductor means 210 to the base of the transistor 256 of each detector, whereby all of the detectors will generate an alarm.

Should an open circuit occur between the terminals 326a and 326b, rendering the intruder sensing portion of the detector or the interconnection between the detectors inoperative, the voltage change at the juncture of the resistors 328 and 330 forward biases the diode 336 and decreases the voltage at the gate of the PUT 302 sufficiently to operate the low battery voltage warning circuit. This warning, like the low battery voltage warning, may be silenced by movement of the switch to the TROUBLE SILENCE position. Should the loop 332 be opened, the LED 228 will extinguish to provide a warning thereof, and power will be supplied to the detector by the battery 224 for continuous detector operation.

The invention thus provides improved embodiments of a detecting device. As a consequence of the detectors being powered by an a.c. line source, operation of the detectors is continuous for as long as the a.c. power is uninterrupted. As a consequence of the battery backup, the detectors continue to operate even upon interruption of the a.c. source, and the probability of the detectors ever being nonresponsive to combustion for lack of power is greatly decreased if not essentially eliminated. Further, the battery supervision circuits warn users of the detectors of the need to replace the batteries, yet do not rapidly deplete the batteries in providing the warning, and the test switches enable the combustion sensing portions of the detectors to be conveniently and completely tested for operability in response to combustion.

While embodiments of the invention have been described in detail, various other modifications and embodiments thereof may be devised by one skilled in the art without departing from the spirit and the scope of the invention, as defined by the appended claims.

What is claimed is:

1. In a warning device, means for connecting with power from a first source thereof; means for connecting with power from a second source thereof, said second source comprising a battery; means for emitting a signal, said emitting means having an active state in which said signal is emitted and an inactive state in which said signal is not emitted; means for detecting the presence of predetermined phenomena; means responsive to said detecting means for placing said emitting means in said active state; means for monitoring the output voltage of said battery and for placing said emitting means in said active state when said voltage equals a first predetermined value; and means for applying power from said first source thereof to said emitting means, said detecting means, said responsive means and said monitoring means, and for applying power thereto from said second source thereof upon interruption of power from said first source.

2. In a warning device as set forth in claim 1, said means responsive to said detecting means placing and maintaining said emitting means in said active state, said means for monitoring periodically placing said emitting means in said active state when said battery voltage equals said first predetermined value.

3. In a warning device as set forth in claim 1, means for establishing a first voltage representative of said output voltage of said battery, said monitoring means monitoring said first voltage and periodically placing said emitting means in said active state when said first voltage equals a second predetermined value.

4. In a warning device as set forth in claim 3, said first source being a source of a.c. voltage, said means for connecting with said first source including voltage rectifier means having an input for receiving a.c. voltage from said first source and an output for providing a d.c. voltage in response thereto, said output being connected with said emitting, detecting, responsive and monitoring means.

5. In a warning device as set forth in claim 4, said means for applying power including a diode connected between said means for connecting with said battery and said rectifier means output, said d.c. voltage having a value sufficient to reverse bias said diode, said diode being forward biased by said battery upon interruption of said a.c. voltage to connect power from said battery with said emitting, detecting, responsive and monitoring means.

6. In a warning device as set forth in claim 1, means for establishing a first voltage representative of said output voltage of said battery, means for establishing a reference potential, said monitoring means including means for comparing said reference potential with said first voltage, and means responsive to said comparing means for periodically placing said emitting means in said active state when said first voltage differs from said reference voltage by a predetermined amount.

7. In a warning device as set forth in claim 6, said comparing means including a unijunction transistor.

8. In a warning device as set forth in claim 7, said unijunction transistor coupled at an anode thereof with said reference potential and at a gate thereof with said first voltage for being rendered conductive when said first voltage differs from said reference potential by said predetermined amount, said means responsive to said comparing means including semiconductor means operably connected with said emitting means, a capacitor connected between said semiconductor means and said anode of said unijunction transistor for being discharged through said anode upon conduction of said transistor, and means for charging said capacitor to the voltage at said anode at a rate slower than the discharge rate of said capacitor through said anode, said semiconductor means being responsive to discharge of said capacitor to place said emitting means in said active state, said transistor becoming nonconductive upon discharge of said capacitor and said capacitor then charging until said transistor is again rendered conductive, whereby said emitting means is periodically placed in said active state.

9. In a warning device as set forth in claim 8, said anode of said transistor coupled with said reference potential through a first diode connected at an anode thereof with said anode of said transistor and at a cathode thereof with said reference potential, and said gate of said transistor coupled with said reference potential through a second diode connected at a cathode thereof with said gate of said transistor and at an anode thereof with said reference potential.

10. In a warning device as set forth in claim 1, manually manipulative means having an operative state for inhibiting said monitoring means from placing said emitting means in said active state.

11. In a warning device as set forth in claim 1, means for generating first, second, third and fourth discernable signals, said generating means being responsive to power from said first source being connected with said device to generate said first signal and to power from said first source being interrupted to generate said second signal, said generating means also being responsive to said monitoring means upon said battery voltage being equal to said first predetermined value to generate said third signal when power from said first source is connected with said device and to generate said fourth signal when power from said first source is interrupted.

12. In a warning device as set forth in claim 11, manually manipulative means having an operative state, connected with said monitoring means for inhibiting said monitoring means from placing said emitting means in said active state, said switch means when inhibiting said monitoring means operating said monitoring means to cause said generating means to generate said third signal when power from said first source is connected with said device and to generate said fourth signal when power from said first source is interrupted.

13. In a warning device as set forth in claim 11, said predetermined phenomena being products of combustion, said means for emitting a signal emitting an audible signal, and said means for generating signals generating visual signals.

14. In a warning device, a power source comprising a battery; means for emitting a signal; means for detecting the presence of predetermined phenomena; means responsive to said detecting means for causing said emitting means to emit said signal, and means for monitoring the output voltage of said battery and for causing said emitting means to emit said signal when said voltage equals a first predetermined value, said monitoring means including means for establishing a first voltage representative of said battery voltage, means for establishing a reference voltage, a unijunction transistor connected at a gate thereof with said first voltage, a first diode connected at a cathode thereof with said transistor gate and at an anode thereof with said reference potential, a second diode connected at a cathode thereof with said reference potential and at an anode thereof with an anode of said transistor, said transistor comparing said first and said reference voltages and being rendered conductive upon said first voltage differing from said reference voltage by a predetermined amount, and circuit means connected with said transistor and said emitting means and responsive to conduction of said transistor to cause said emitting means to emit said signal.

15. In a warning device as set forth in claim 14, said circuit means including semiconductor means operatively connected with said emitting means, a capacitor connected with said semiconductor means and said transistor anode for being discharged upon conduction of said transistor, and means for charging said capacitor to the voltage at said transistor anode at a rate which is slower than the discharge rate of said capacitor through said anode, said semiconductor means being responsive to discharge of said capacitor upon conduction of said transistor to cause said emitting means to emit said signal, said transistor becoming nonconductive upon discharge of said capacitor and said capacitor then charging until said transistor is again rendered conductive, whereby said emitting means periodically emits said signal upon said first voltage differing from said reference voltage by said predetermined amount.

16. In a warning device as set forth in claim 14, said emitting means emitting an audible signal, means for generating a visual signal, said monitoring means causing said generating means to generate said visual signal upon said first voltage differing from said reference voltage by said predetermined amount.

17. In a warning device as set forth in claim 16, manually manipulative switch means connected with said monitoring means and operative to inhibit said monitoring means from causing said emitting means to emit said audible signal.

18. In a warning device as set forth in claim 17, said monitoring means being responsive to said switch means when said switch means is operated to cause said generating means to generate said visual signal.

19. In a warning device, means for connecting with power from a first source thereof; means for connecting with power from a second source thereof, said second source comprising a battery; means for providing first and second audible warnings, said first audible warning being sensually discernable from said second warning; sensor means for detecting the presence of combustion;

means responsive to said sensor means for causing said providing means to provide said first warning; means for monitoring the output voltage of said battery and for causing said providing means to provide said second warning when said voltage equals a predetermined value, and means for applying power from said first source thereof to said providing, sensor, responsive and monitoring means, and for applying power thereto from said second source upon interruption of power from said first source.

20. In a warning device as set forth in claim 19, means for establishing a first voltage representative of said battery voltage, and means for establishing a reference voltage, said monitoring means including means for comparing said first voltage with said reference voltage, and means responsive to said comparing means for causing said providing means to provide said second signal when said first voltage differs from said reference voltage by a predetermined amount.

21. In a warning device as set forth in claim 19, means responsive to power from said first source being connected with said device for generating a first visual signal and for generating a second sensually discernably different visual signal when power from said first source is interrupted.

22. In a warning device as set forth in claim 19, means for generating first, second, third and fourth visually discernable signals, connected with said monitoring means and said means for connecting with power from said first source and responsive thereto for generating, when said battery voltage is at other than said predetermined value, said first signal when power from said first source is connected with said device and said second signal when power from said first source is interrupted, and for generating, when said battery voltage is at said predetermined value, said third signal when power from said first source is connected with said device and said fourth signal when power from said first source is interrupted.

23. In a warning device as set forth in claim 19, manually manipulative switch means connected with said monitoring means for blocking said monitoring means from causing said providing means to provide said second audible warning when said battery voltage equals said predetermined value.

24. In a warning device as set forth in claim 22, manually manipulative switch means connected with said monitoring means, said switch means having an operative state blocking said monitoring means from causing said providing means to provide said second audible warning when said battery voltage equals said predetermined value and operating said monitoring means to cause said generating means to provide said third visual signal when power from said first source is connected with said device and said fourth visual signal when power from said first source is interrupted.

25. In a warning device as set forth in claim 20, said comparing means including a unijunction transistor, a first diode connected at an anode thereof with an anode of said transistor and at a cathode thereof with said reference voltage, a second diode connected at an anode thereof with said reference voltage and at a cathode thereof with a gate of said transistor, said gate of said transistor connected with said first voltage, said transistor being rendered conductive when said first voltage differs from said reference voltage by said predetermined amount, semiconductor circuit means operably connected with said means for providing said audible warning, a capacitor connected between said transistor and said semiconductor circuit means, and means for changing said capacitor, said capacitor discharging through said transistor upon conduction thereof, said semiconductor circuit means being responsive to discharge of said capacitor to cause said providing means to provide said second warning.

26. In a warning device as set forth in claim 25, said capacitor being connected with said anode of said transistor for being discharged therethrough upon conduction thereof, said charging means charging said capacitor at a rate which is slower than the discharge rate of said capacitor, said transistor becoming nonconductive upon discharge of said capacitor and said capacitor then charging until said transistor is again rendered conductive, whereby said second warning is a periodic audible signal.

27. In a warning device as set forth in claim 19, said sensor means including a sensor having an impedance which changes in response to the presence of products of combustion, in series with a reference impedance to form a bridge circuit, one of said power sources applying power across said bridge circuit and said juncture between said sensor and said reference impedance having essentially a first potential in the absence of combustion and at least a second potential upon the presence of combustion, said responsive means being responsive to said juncture having at least said second potential for causing said providing means to provide said first warning, including manually manipulable means connected with said bridge circuit for changing the voltage thereacross sufficiently to change the potential at said juncture to at least said second potential to test said warning device.

28. In a warning device as set forth in claim 19, said first source of power being a source of a.c. voltage, said means for connecting with said first source of power including voltage rectifier means for receiving a.c. voltage from said first source at an input thereto and for providing a d.c. voltage in response thereto at an output therefrom, said output being connected with said providing means, said sensor means, said responsive means and said monitoring means.

29. In a warning device as set forth in claim 28, said means for applying power including a diode connected between said rectifier means output and said means for connecting with said battery, said d.c. voltage having a value sufficient to reverse bias said diode, said diode being forward biased by said battery upon interruption of said a.c. voltage to apply power from said battery to said providing means, said sensor means, said responsive means and said monitoring means.

* * * * *

REEXAMINATION CERTIFICATE (1403rd)
United States Patent [19]
Schneider et al.

[11] B1 4,138,670
[45] Certificate Issued  Jan. 15, 1991

[54] A.C. POWERED DETECTING DEVICE WITH BATTERY BACKUP

[75] Inventors: Quentin L. Schneider, Bensenville; Richard J. Schwarzbach, Naperville, both of Ill.

[73] Assignee: Pittway Corp., Northbrook, Ill.

Reexamination Request:
  No. 90/001,930, Feb. 2, 1990

Reexamination Certificate for:
  Patent No.: 4,138,670
  Issued: Feb. 6, 1979
  Appl. No.: 756,494
  Filed: Jan. 3, 1977

[51] Int. Cl.⁵ .................. G08B 29/00; G08B 17/10
[52] U.S. Cl. ............................. 340/507; 340/509; 340/629; 340/636; 340/693; 340/333; 340/628; 340/511
[58] Field of Search .............. 340/333, 571, 628–630, 340/514, 507, 506, 509, 636, 693

[56]  References Cited
  U.S. PATENT DOCUMENTS

| | | | |
|---|---|---|---|
| 3,060,416 | 10/1962 | Brown | 340/509 |
| 3,728,706 | 4/1973 | Tipton et al. | 340/517 |
| 3,811,123 | 5/1974 | Hamm et al. | 340/636 |
| 3,899,732 | 8/1975 | Staby | 340/628 |
| 3,931,620 | 1/1976 | Wellman, Jr. et al. | 340/599 |
| 3,955,186 | 5/1976 | Green et al. | 340/634 |
| 3,980,997 | 9/1976 | Berns et al. | 340/630 |
| 4,030,086 | 6/1977 | Salem | 340/629 |
| 4,065,759 | 12/1977 | Handing | 340/630 |

Primary Examiner—Donnie L. Crosland

[57]  ABSTRACT

An improved a.c. voltage powered warning device for detecting the occurrence of predetermined phenomena, is characterized by battery backup for providing power to the device in the event of interruption of the a.c. voltage. In the disclosed embodiments the warning device is a fire detector having circuitry for supervising the energy level of the backup battery and for providing a warning upon the energy level decreasing to a predetermined value, and for testing a combustion detecting and alarm generating portion of the detector.

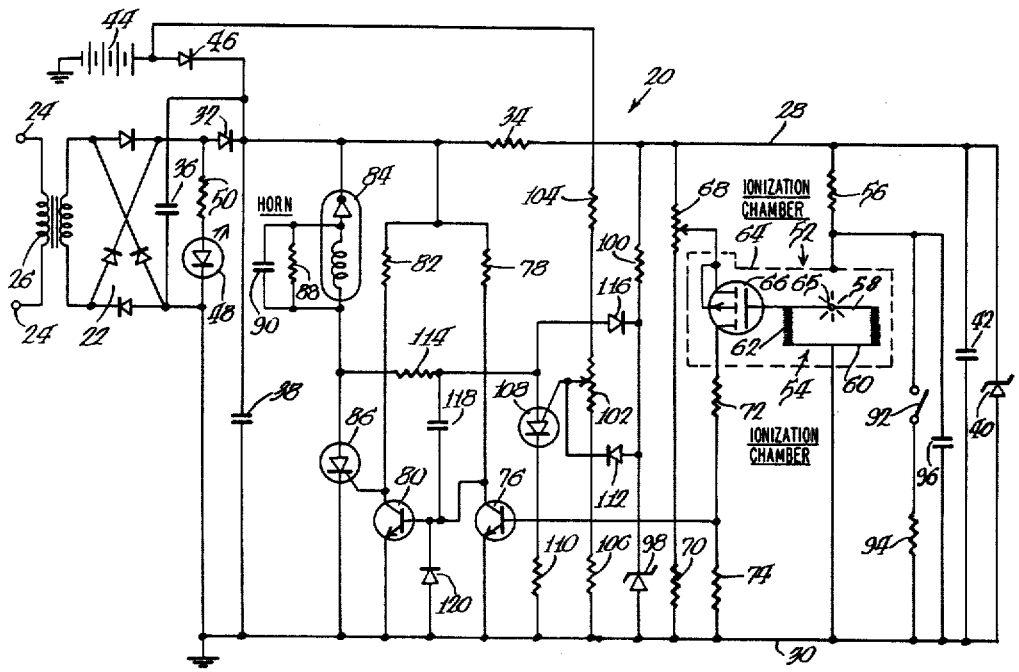

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-29 is confirmed.

* * * * *

REEXAMINATION CERTIFICATE (2341st)

United States Patent [19]

Schneider et al.

[11] B1 4,138,670

[45] Certificate Issued Jul. 26, 1994

[54] A.C. POWERED DETECTING DEVICE WITH BATTERY BACKUP

[75] Inventors: Quentin L. Schneider, Bensenville; Richard J. Schwarzbach, Naperville, both of Ill.

[73] Assignee: Pittaway Corporation, Northbrook, Ill.

Reexamination Requests:
No. 90/002,999, Mar. 5, 1993
No. 90/003,069, May 26, 1993

Reexamination Certificate for:
Patent No.: 4,138,670
Issued: Feb. 6, 1979
Appl. No.: 756,494
Filed: Jan. 3, 1977

Reexamination Certificate B0 4,138,670 issued Jan. 15, 1991.

[51] Int. Cl.$^5$ .................. G08B 29/00; G08B 17/10
[52] U.S. Cl. .................. 340/507; 340/509; 340/629; 340/636; 340/693; 340/333; 340/628; 340/511
[58] Field of Search ........... 340/507, 509, 629, 636, 340/693

[56] References Cited

U.S. PATENT DOCUMENTS

| | | |
|---|---|---|
| 3,060,416 | 10/1962 | Brown . |
| 3,235,858 | 2/1966 | Mader . |
| 3,717,862 | 2/1973 | Sasaki . |
| 3,728,706 | 4/1973 | Tipton et al. . |
| 3,811,123 | 5/1974 | Hamm et al. . |
| 3,812,362 | 5/1974 | Lansen et al. . |
| 3,892,930 | 7/1975 | Wieder . |
| 3,899,732 | 8/1975 | Staby . |
| 3,906,474 | 9/1975 | Lehsten . |
| 3,931,620 | 1/1976 | Wellman, Jr. et al. . |
| 3,955,186 | 5/1976 | Green et al. . |
| 3,980,997 | 9/1976 | Berns et al. . |
| 4,004,288 | 1/1977 | Webb, Jr. . |
| 4,030,086 | 6/1977 | Salem . |
| 4,065,759 | 12/1977 | Handing . |
| 4,081,684 | 3/1978 | Wieder . |
| 4,083,037 | 4/1978 | Larsen . |
| 4,088,986 | 5/1978 | Boucher . |

OTHER PUBLICATIONS

Master Lock 2553 Smoke Detector, Circuit Diagram, Dec. 1975.
Master Lock document "Two New Early Warning Fire Alarms from Master Lock", No. 2553, No. 2551, Dec. 1975.
Master Lock Catalog pp. A-250R1, A-250R2.
Master Lock Sales Bulletin dated Apr. 2, 1975.
Unitec UT-311 Data Sheet Dec. 1975.
Unitec 3110 Service Manual Dec. 1975.
Pyr-a-larm CS-3 Manual Dec. 1975.
Pyr-a-larm UL Report pertaining to CS-1, CS-3 Detectors Dec. 1975.

*Primary Examiner*—Donnie L. Crosland

[57] ABSTRACT

An improved a.c. voltage powered warning device for detecting the occurrence of predetermined phenomena, is characterized by battery backup for providing power to the device in the event of interruption of the a.c. voltage. In the disclosed embodiments the warning device is a fire detector having circuitry for supervising the energy level of the backup battery and for providing a warning upon the energy level decreasing to a predetermined value, and for testing a combustion detecting and alarm generating portion of the detector.

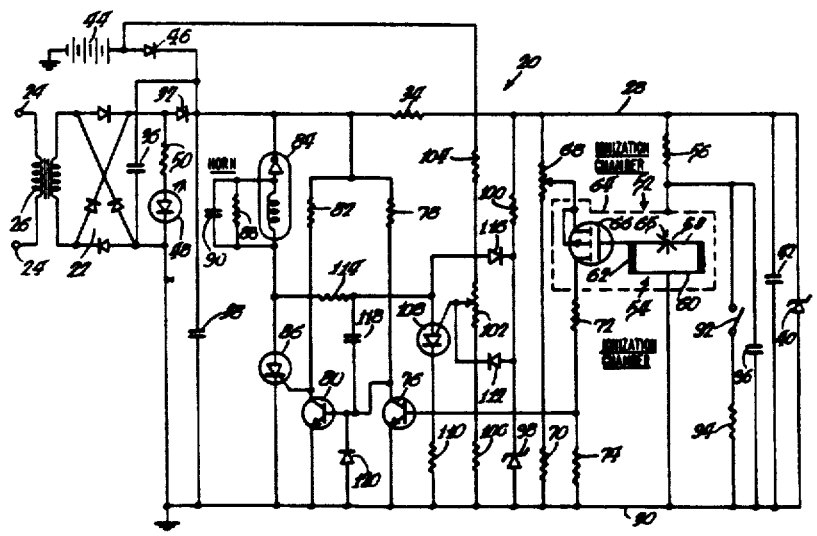

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claim 8, 9, 11-18, 22, 24-26 is confirmed.

Claims 1-7, 10, 19-21, 23, 27-29 are cancelled.

* * * * *